US 12,222,655 B2

(12) United States Patent
Modeste et al.

(10) Patent No.: US 12,222,655 B2
(45) Date of Patent: Feb. 11, 2025

(54) STOP, OPTICAL SYSTEM AND LITHOGRAPHY APPARATUS

(71) Applicant: Carl Zeiss SMT GmbH, Oberkochen (DE)

(72) Inventors: Benjahman Julius Modeste, Elchingen (DE); Toralf Gruner, Aalen-Hofen (DE); Daniel Golde, Oberkochen (DE); Ulrich Loering, Ulm (DE); Ralf Zweering, Aalen (DE); Stefan Xalter, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 368 days.

(21) Appl. No.: 17/554,029

(22) Filed: Dec. 17, 2021

(65) Prior Publication Data

US 2022/0107567 A1 Apr. 7, 2022

Related U.S. Application Data

(63) Continuation of application No. PCT/EP2020/068239, filed on Jun. 29, 2020.

(30) Foreign Application Priority Data

Jul. 4, 2019 (DE) .......................... 102019209884.3

(51) Int. Cl.
*G03F 7/20* (2006.01)
*G02B 5/00* (2006.01)
(Continued)

(52) U.S. Cl.
CPC ........... *G03F 7/7025* (2013.01); *G02B 5/005* (2013.01); *G02B 17/0848* (2013.01); *G02B 17/0892* (2013.01)

(58) Field of Classification Search
CPC ............... G03F 7/7025; G03F 7/70308; G03F 7/70908; G03F 7/70933; G03F 7/70941;
(Continued)

(56) References Cited

U.S. PATENT DOCUMENTS

2002/0149753 A1* 10/2002 Hase ...................... G03B 27/42
355/53
2004/0179174 A1 9/2004 Coon et al.
(Continued)

FOREIGN PATENT DOCUMENTS

DE 10 2017 207 726 A1 7/2017
DE 10 2017 212 874 A1 9/2017
(Continued)

OTHER PUBLICATIONS

International Search Report and Written Opinion for corresponding PCT Appl No. PCT/EP2020/068239, dated Oct. 14, 2020.
(Continued)

*Primary Examiner* — Mesfin T Asfaw
(74) *Attorney, Agent, or Firm* — Fish & Richardson P.C.

(57) ABSTRACT

A stop, such as a numerical aperture stop, obscuration stop or false-light stop, for a lithography apparatus, includes a light-transmissive aperture and a stop element, in which or at which the aperture is provided. The stop element is opaque and fluid-permeable outside the aperture.

20 Claims, 12 Drawing Sheets

(51) Int. Cl.
*G03F 7/00* (2006.01)
*G02B 17/08* (2006.01)

(58) Field of Classification Search
CPC . G03F 7/70883; G03F 7/70891; G02B 5/005; G02B 17/0848; G02B 17/0892; G02B 5/006
See application file for complete search history.

(56) References Cited

U.S. PATENT DOCUMENTS

| | | |
|---|---|---|
| 2006/0244941 A1* | 11/2006 | Gruner .............. G03F 7/70558 355/69 |
| 2008/0129971 A1 | 6/2008 | Sakamoto |
| 2009/0314967 A1 | 12/2009 | Moriya et al. |
| 2011/0285979 A1 | 11/2011 | Dieckmann et al. |

FOREIGN PATENT DOCUMENTS

| | | | |
|---|---|---|---|
| JP | 2005-086148 | A | 3/2005 |
| TW | 200905408 | A | 2/2009 |
| TW | 201106002 | A | 2/2011 |
| TW | 201919860 | A | 6/2019 |

OTHER PUBLICATIONS

Taiwanese Office Action, with translation thereof, for corresponding TW Patent Appl. No. 109122326, dated Jan. 23, 2024.

\* cited by examiner

STOP, OPTICAL SYSTEM AND LITHOGRAPHY APPARATUS

CROSS-REFERENCE TO RELATED APPLICATIONS

The present application is a continuation of, and claims benefit under 35 USC 120 to, international application PCT/EP2020/068329, filed Jun. 29, 2020, which claims benefit under 35 USC 119 of German Application No. 10 2019 209 884.3, filed on Jul. 4, 2019. The entire disclosure of these applications are incorporated by reference herein.

FIELD

The present disclosure relates to a stop, such as an aperture stop, an obscuration stop or a false-light stop, for a lithography apparatus, an optical system with at least one such stop, and a lithography apparatus with at least one such stop and/or at least one such optical system.

BACKGROUND

Microlithography is used for producing microstructured components, for example integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses (extreme ultraviolet, EUV) that use light with a wavelength in the range of 0.1 nm to 30 nm, such as 13.5 nm, are currently under development. In the case of such EUV lithography apparatuses, because of the high absorption of light of this wavelength by most materials, reflective optical units, that is to say mirrors, are typically used instead of—as previously—refractive optical units, that is to say lens elements. The mirrors operate either with almost normal incidence or with grazing incidence.

In DUV (deep ultraviolet) lithography apparatuses, a gas flow through the system is frequently implemented. The "system" can here be understood to mean for example the projection system of the lithography apparatus or the lithography apparatus itself. The gas flow can be realized for example by blowing in and venting nitrogen or air. The gas flow effects cooling of the optical elements, heated by the absorption of light, and the discharge of harmful substances that could otherwise accumulate in the system due to facestory influences or outgassing.

Since EUV radiation has a relatively low transmissivity through air, operation in the case of EUV wavelengths generally takes place under a vacuum. However, a low gas pressure of approx. one pascal prevails here, too. Hydrogen can be used here for the gas flow. The gas flow is provided to contribute to the photo-cleaning and occasionally realize a limited cooling effect.

The gas flow is implemented by few inlet positions and outlet openings, wherein the challenge in terms of design is to keep the number of such openings low. For this reason, the gas should flow through the system in a defined manner, for example as freely as possible. At the same time, however, the system has a multiplicity of shading stops, such as aperture stops, obscuration stops and/or false-light stops, for example, which could obstruct the gas flow.

A numerical aperture stop has the task of trimming working light in a radial direction with reference to a beam path from the outside to the inside. By contrast, an obscuration stop has the task of covering an obscuration in the beam path. To this end, the obscuration stop cuts out a—with reference to the beam path in the radial direction—inner part of the working light. False-light stops are frequently positioned in intermediate image regions or intermediate image planes. The abovementioned stops bring about a largely field-constant exit pupil, which is important for the functionality of lithography systems. False-light stops moreover ensure that light that does not contribute any useful imaging function and merely leads to a contrast-reducing background is filtered out.

The stops are typically designed in the form of thin metal sheets having an adapted geometry and aperture. As a result, the stops are comparatively light-weight and stiff and do not introduce any undesired substances into the system. This setup furthermore permits cheap yet precise manufacturing. In this compact form, however, the stops block the desired gas flow through the system. This decreases either the desired cooling and cleaning effects of the gas flow or involves a greater system complexity owing to additional inlet and outlet openings. The aim is to unify these contradicting demands, that is, to be opaque and gas-permeable.

SUMMARY

The present disclosure seeks to provide an improved stop.

In an aspect, a stop, such as a numerical aperture stop, an obscuration stop or a false-light stop, for a lithography apparatus is proposed. The stop includes a light-transmissive aperture and at least one stop element in which or at which the aperture is provided, wherein the stop element is opaque and fluid-permeable outside the aperture.

Because the stop element is fluid-permeable outside the aperture, it is possible to prevent the stop from blocking a gas flow through an optical system, for example through a projection system, of the lithography apparatus. In this way, the desired cooling and cleaning effects of the gas flow can be maintained. A greater system complexity due to additional inlet and outlet openings for the gas flow is not necessary.

The aperture can be transmissive for EUV radiation or DUV radiation. The aperture can be a perforation of any desired shape in the stop element or be a cutout of any desired shape at the stop element. A "perforation" is understood to mean a geometry of any desired shape perforating the stop element and with a fully enclosing delimitation or edge. By contrast, a "cutout" is understood to mean a geometry perforating the stop element that has no enclosing delimitation or edge. In other words, such a cutout is provided at a periphery of the stop element and extends from the periphery into the stop element.

In general, at least exactly one stop element is provided. However, a plurality of stop elements, for example two or three stop elements, can also be provided. The number of the stop elements is arbitrary, however. The aperture being provided "in or at" the stop element is understood to mean in particular that the aperture is either fully surrounded by material of the stop element—as was just explained with reference to the perforation—and is thus located in the stop element or that the aperture is not fully surrounded by material of the stop element—as was just explained with reference to the cutout—and is therefore located at the stop element.

"Outside" the aperture relates to a region of the stop element in which or at which the aperture is not provided. This can be, for example, a region next to the aperture that fully or partially encloses the aperture. "Opaque" is understood to mean in the present case in particular an opacity to EUV radiation and/or DUV radiation. That is to say the stop element is transmissive for light, such as for EUV radiation and/or DUV radiation, only at the aperture.

The stop element being "fluid-permeable" is understood to mean that a fluid, for example a gas, such as air, nitrogen or hydrogen, or a liquid can flow through the stop element from a front side of the stop to a rear side thereof, and vice versa. The fluid here does not flow through the aperture but outside of or next to the aperture through the material of the stop element itself. This does not rule out, however, that the fluid can additionally also flow through the aperture.

According to one embodiment, the stop is designed to deflect a fluid flow, flowing through the stop, a number of times.

The stop can deflect the fluid flow for example at least once. The light that is incident on the stop element next to the aperture, on the other hand, is not deflected but blocked by the stop element.

According to an embodiment, the at least one stop element has a multiplicity of openings arranged such that the at least one stop element is opaque and fluid-permeable.

For example, the openings are positioned offset to one another in a direction in which the light is incident on the stop. Hereby, the fluid flow can be deflected as it flows through the stop element. The light, by contrast, can be blocked by the offset arrangement of the openings.

According to an embodiment, the openings fluidically connect a front side and a rear side of the stop to one another.

In other words, the fluid can flow from the front side through the openings to the rear side, or vice versa.

According to an embodiment, the openings are circular or rectangular in cross section.

However, the openings can also have any other geometry. For example, the openings can be triangular or oval. An "opening" in the present case is understood to be in particular a clearance or a perforation perforating the stop element.

According to an embodiment, the stop furthermore includes a first stop element with first openings and a second stop element with second openings, with the first openings and the second openings being arranged with an offset with respect to one another.

The openings being "arranged with an offset" means in particular that the first openings and the second openings do not overlap one another, with the result that the fluid flow is deflected at least once as it flows from a first opening to a second opening. The number of the stop elements is arbitrary. Exactly two stop elements may be provided. However, it is also possible that three or four stop elements are provided.

According to an embodiment, the first openings and the second openings are arranged with an offset with respect to one another such that the first stop element completely covers the second openings and the second stop element completely covers the first openings.

For example, the stop elements can cover the respective openings in the direction in which the light is incident on the stop in such a way that the light can still be incident on the second stop element through the first openings, but is then blocked there by the second stop element. The fluid, meanwhile, can be deflected at the second stop element and flows through the second openings to the rear side of the stop.

According to an embodiment, the first stop element is arranged at a distance from the second stop element.

Thus, an intermediate space can be provided between the first stop element and the second stop element. The distance can be dimensioned here such that the fluid can flow freely between the first stop element and the second stop element. The distance can be a few fractions of millimetres to a few millimetres.

According to an embodiment, the openings are in the shape of slits and pass through the at least one stop element at an angle of inclination.

In this case, exactly one stop element that can be embodied as a monolithic body can be provided. A non-slitted frame can extend around the openings and can ensure sufficient stability of the stop.

According to an embodiment, the at least one stop element is made from a porous material, which is fluid-permeable owing to its porous structure.

Exactly one stop element can be provided in this case, too. For example, the stop element can be made from ceramic or metal. For example, granulate grains, for example metal powder or ceramic powder, can be sintered together for this purpose. This can provide an open-pore structure that is fluid-permeable but opaque.

According to an embodiment, the aperture is fluid-permeable.

That means that both the stop element itself and the aperture provided in or at the stop element is fluid-permeable.

According to an embodiment, the aperture is delimited with the aid of a light-determining edge, wherein the light-determining edge is closed in terms of its perimeter or is open in terms of its perimeter.

The "light-determining edge" is a contour of the aperture with the aid of which the beam path is trimmed. "Closed in terms of its perimeter" here means that the light-determining edge fully encloses the aperture. "Open in terms of its perimeter" means in particular that the light-determining edge does not fully enclose the aperture.

In an aspect, the disclosure provides an optical system for a lithography apparatus. The optical system includes an object plane, a field plane, an intermediate image plane arranged between the object plane and the field plane, and at least one stop as explained above, wherein the stop is arranged in the intermediate image plane to filter out false light from a beam path of the optical system upstream of the field plane during the operation of the optical system.

Object points from the object plane in which for example an object in the form of a photomask is arranged are imaged into the field plane and into the intermediate image plane. A wafer to be exposed can be positioned in the field plane. A pupil plane having a numerical aperture stop can be positioned between the object plane and the intermediate image plane.

According to one embodiment, the optical system furthermore includes a plurality of stops arranged successively in the beam path.

The number of the stops is arbitrary. Numerical aperture stops, obscuration stops, scattered-light stops or false-light stops can be provided.

Furthermore, a lithography apparatus with at least one such stop and/or with at least one such optical system is proposed.

The lithography apparatus can be an EUV lithography apparatus or a DUV lithography apparatus. EUV stands for "extreme ultraviolet" and denotes a wavelength of the working light of between 0.1 nm and 30 nm. DUV stands for "deep ultraviolet" and denotes a wavelength of the working light of between 30 nm and 250 nm.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

The embodiments and features described for the stop are correspondingly applicable to the proposed optical system and respectively to the proposed lithography apparatus, and vice versa.

Further possible implementations of the disclosure also include not explicitly mentioned combinations of features or embodiments that are described above or below with respect to the exemplary embodiments. In this case, a person skilled in the art will also add individual aspects as improvements or supplementations to the respective basic form of the disclosure.

Further aspects configurations and aspects of the disclosure are the subject matter of the dependent claims and also of the exemplary embodiments of the disclosure described below. In the text that follows, the disclosure is explained in more detail on the basis of embodiments and with reference to the accompanying figures.

DETAILED DESCRIPTION

Identical elements or elements having an identical function have been provided with the same reference signs in the figures, unless indicated to the contrary. It should also be noted that the illustrations in the figures are not necessarily true to scale. Obscured components are illustrated in dashed lines in the figures.

Figure 1A:
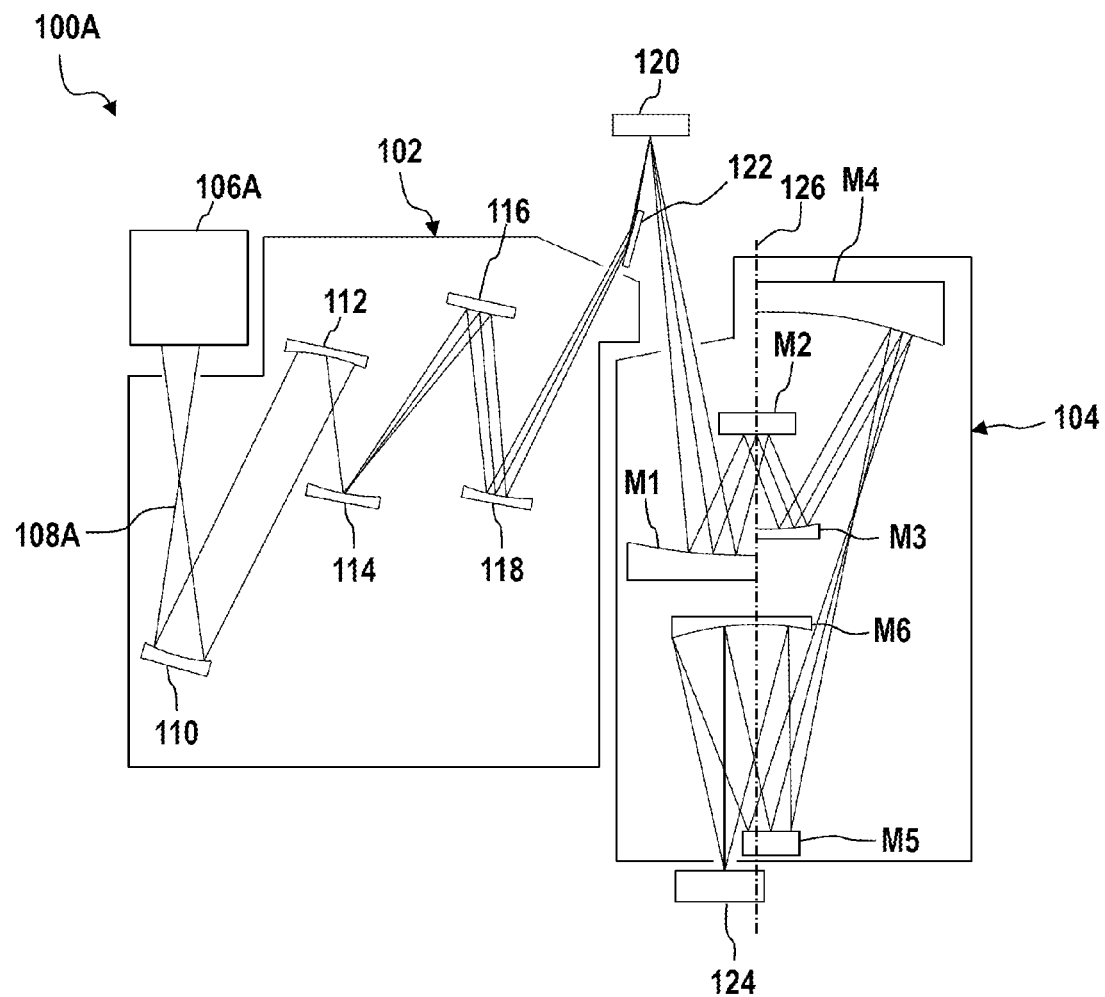
FIG. 1A shows a schematic view of one embodiment of an EUV lithography apparatus.

FIG. 1A shows a schematic view of an EUV lithography apparatus 100A, which includes a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (reticle) 120. The photomask 120 is likewise embodied as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as a projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number represented. A greater or lesser number of mirrors M1 to M6 can also be provided. Furthermore, the mirrors M1 to M6 are generally curved on their front side for beam shaping.

Figure 1B:
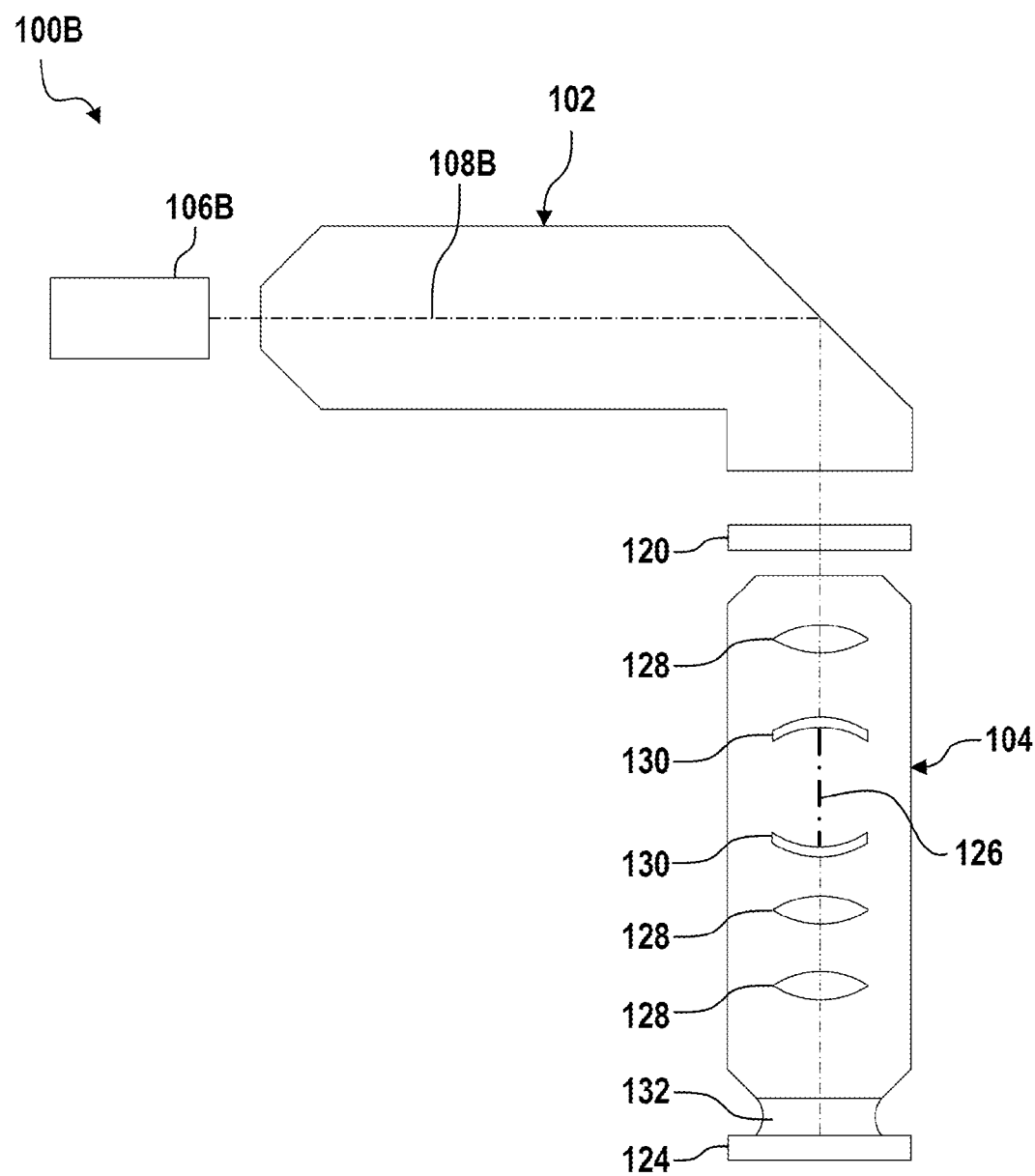
FIG. 1B shows a schematic view of one embodiment of a DUV lithography apparatus.

FIG. 1B shows a schematic view of a DUV lithography apparatus 100B, which includes a beam shaping and illumination system 102 and a projection system 104. In this case, DUV stands for "deep ultraviolet" and denotes a wavelength of the working light of between 30 nm and 250 nm. As has already been described with reference to FIG. 1A, the beam shaping and illumination system 102 and the projection system 104 can be arranged in a vacuum housing and/or be surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved on their front side for beam shaping.

Figure 2:
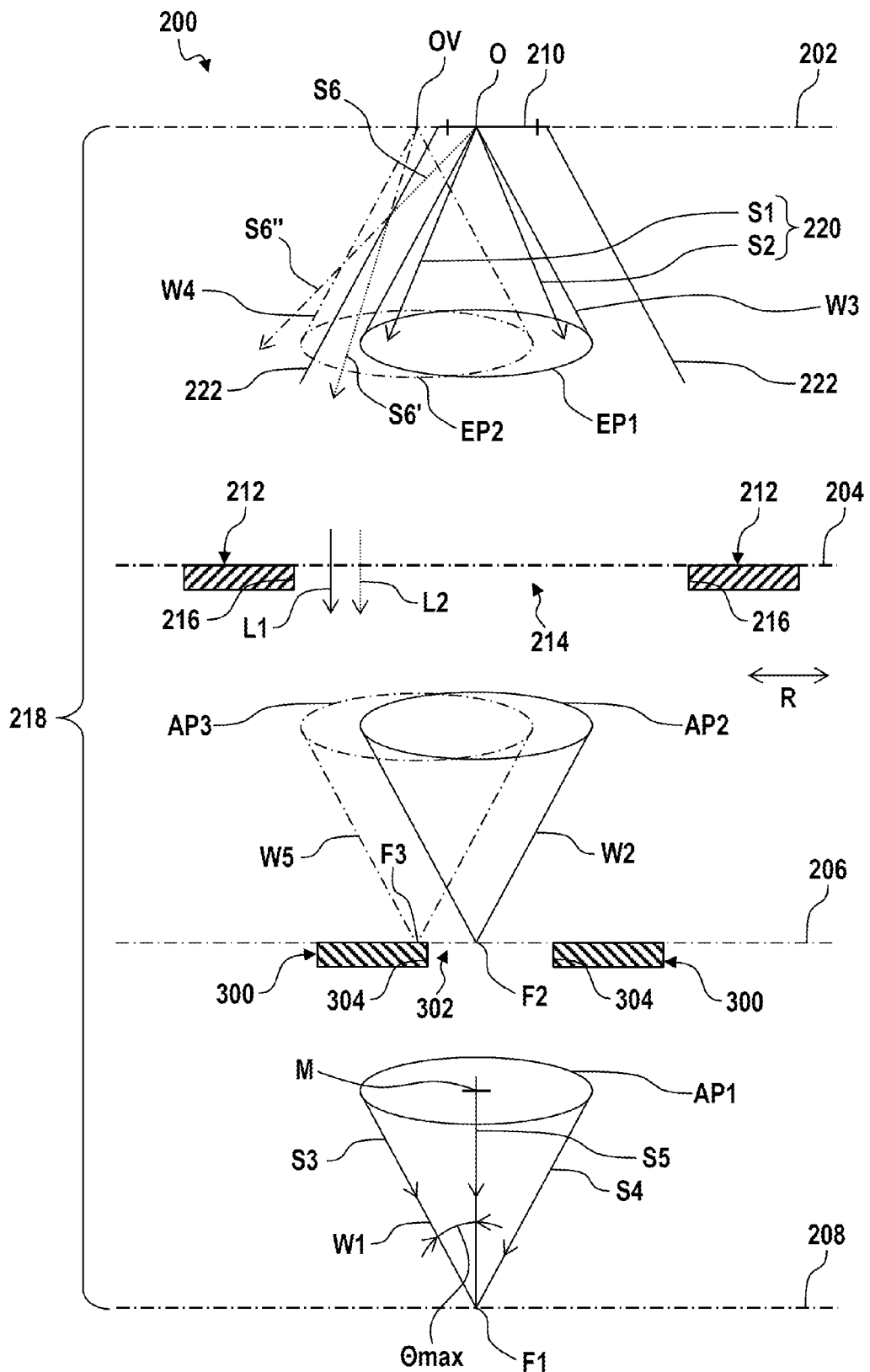
FIG. 2 shows a schematic view of one embodiment of an optical system for the lithography apparatus in accordance with FIG. 1A or FIG. 1B.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution. The medium 132 can also be referred to as an immersion liquid.

s FIG. 2 shows a schematic view of an optical system 200. The optical system 200 is part of an EUV lithography apparatus 100A or of a DUV lithography apparatus 100B as explained above. The optical system 200 can be a projection system 104 as explained above or be a part of such a projection system 104.

The optical system 200 includes for example an object plane 202, a pupil plane 204, an image or intermediate image plane 206 and a field plane 208. A further pupil plane 204, which is however not shown in FIG. 2, can be provided between the intermediate image plane 206 and the field plane 208. An object field or used field 210 having a multiplicity of object points O, of which however only one is provided with a reference sign in FIG. 2, is provided in the object plane 202. The object points O are imaged onto field points F1 in the field plane 208 and onto field points F2 in the intermediate image plane 206 with the aid of the pupil plane 204 or with the aid of the pupil planes 204.

An object (not shown) is positioned in the object plane 202. The object can be the photomask 120. The used field 210 is provided at or on the object or at or on the photomask 120. For example the wafer 124 to be exposed is arranged in the field plane 208. In general, the field plane 208 can also be an image plane or intermediate image plane.

Instead of the object plane 202, it is also possible for a field plane to be provided, wherein images therein are imaged onto the field plane 208 and onto the intermediate image plane 206. The pupil plane 204 can be provided between the object plane 202 and the field plane 208. The pupil plane 204 is thus arranged neither on the object side nor on the image side.

One or more stops are arranged in the pupil plane 204. According to the exemplary embodiment, a numerical aperture stop 212 (NA stop) is provided. An obscuration stop (not shown) can furthermore also be provided. The NA stop 212 includes an aperture 214 that is defined by a light-determining edge 216. The light-determining edge 216 can be enclosing. The aperture 214 can have any desired geometry. The NA stop 212 can be made of multiple parts, meaning that the geometry of the aperture 214 is adjustable.

The NA stop 212 defines, together with the planes 202, 204, 206, 208, a beam path 218, along which working light 220 travels through the optical system 200. Instead of or in addition to the NA stop 212, it is also possible for a scattered-light stop and/or false-light stop (not shown) to be provided in the pupil plane 204 or at different positions, specifically in the intermediate image plane 206, as will be explained below with reference to the intermediate image plane 206.

The working light 220 here includes by way of example light rays S1, S2, that describe the imaging of the object points O onto the intermediate image plane 206 and onto the field plane 208. The illustration is purely schematic, meaning that a multiplicity of optical elements, such as mirrors, lens elements, optical gratings and/or the like, can be arranged between the object plane 202 and the pupil plane 204, between the pupil plane 204 and the intermediate image plane 206, and between the intermediate image plane 206 and the field plane 208. The optical elements can include, for example, the mirrors M1 to M6, 110, 112, 114, 116, 118, 130 and/or the lens elements 128.

The NA stop 212 has the task of trimming the working light 220 in a radial direction R with reference to the beam path 218 from the outside to the inside and thus delimits a maximum half image-side opening angle $\theta_{max}$ of a light-filled angle space W1, which is assigned to the field point F1. The opening angle $\theta_{max}$ in turn specifies the numerical aperture of the optical system 200. For a large numerical aperture, the opening angle $\theta_{max}$ is very large and the angle space W1 accordingly has a flat conical geometry. For a small numerical aperture, the opening angle $\theta_{max}$ is very small and the angle space W1 accordingly has an acute conical geometry.

The field point F1 is assigned an exit pupil AP1. The exit pupil AP1 is an image-side imaged representation of the NA stop 212. FIG. 2 furthermore shows an entrance pupil EP1 for the object point O. The entrance pupil EP1 is an object-side imaged representation of the NA stop 212. Each field point F1 is assigned an exit pupil AP1. Each object point O is assigned an entrance pupil EP1.

The exit pupil AP1 defines via the field point F1 the light-filled angle space W1. The angle space W1 is delimited by marginal (light) rays S3, S4. These are incident in each case on the field point F1 at the half image-side maximum opening angle $\theta_{max}$. The maximum opening angle $\theta_{max}$ is measured between the respective marginal ray S3, S4 and a central (light) ray S5 onto the field point F1. The central ray S5 intersects a centre point M of the exit pupil AP1. The field point F2 is assigned an intermediate image pupil AP2, which defines an angle space W2. The entrance pupil EP1 is likewise assigned such an angle space W3.

Figure 3:
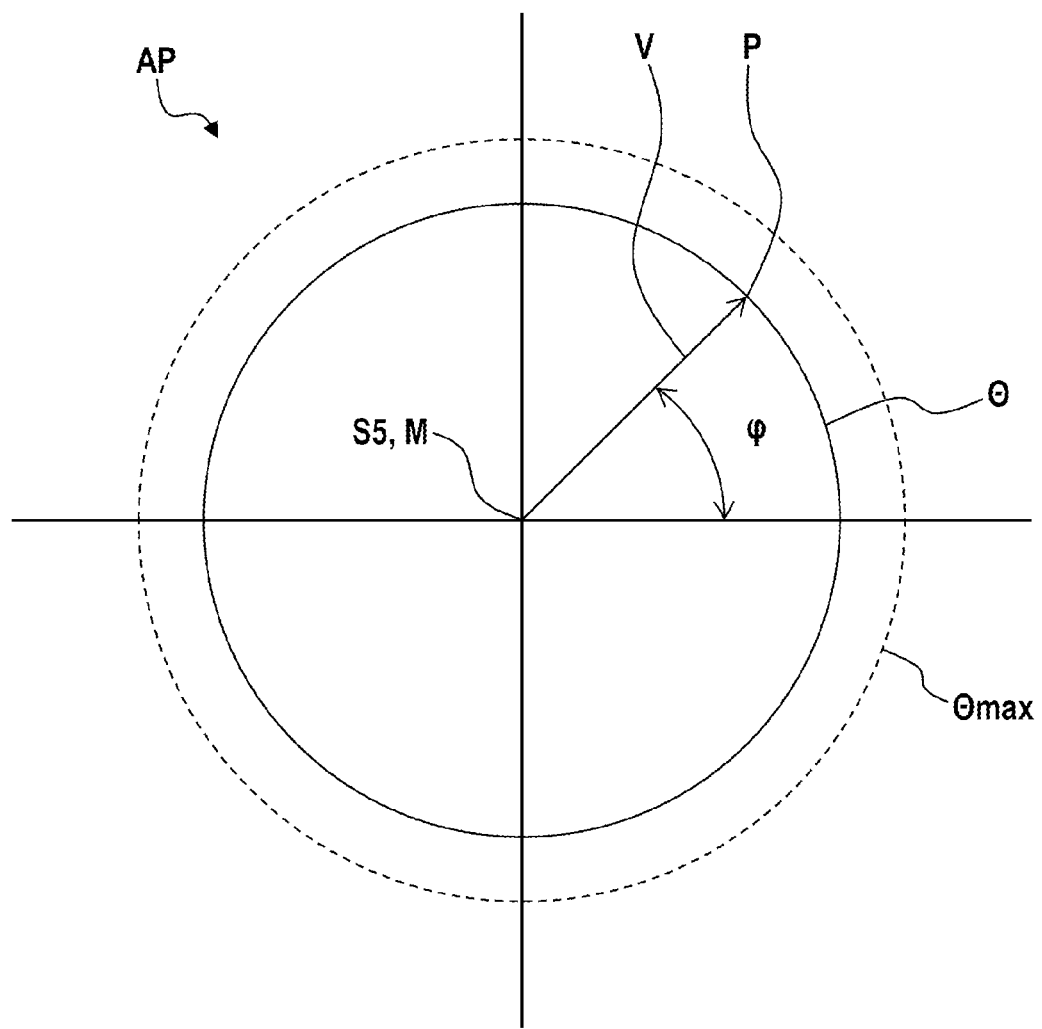
FIG. 3 shows a schematic view of an exit pupil for the optical system according to FIG. 2.

As is shown in FIG. 3, each point P of the exit pupil AP1 can be described with the aid of a direction vector V. The direction vector V has an opening angle $\theta$ with respect to the central ray S5. The direction vector V furthermore has a circumferential angle $\varphi$ in the circumferential direction around the centre point M. In general, each light ray in the exit pupil AP1—described by the angles $\theta$, $\varphi$—is assigned one location in the pupil plane 204.

In other words, each field point F1 of the field plane 208 thus sees all the light points in the pupil plane 204. This is also true in the reverse: The light in an angle space over the pupil plane 204 is assigned a location in the field plane 208. The exit pupil AP1 is thus field constant. The light that is incident on the field plane 208 is constant for every field point F1.

As mentioned above, the entrance pupil EP1 is the object-side imaged representation of the NA stop 212. The entrance pupil EP1 can also be called the used aperture or be equated thereto. During the operation of the lithography apparatus 100A, 100B, light is also diffracted at the photomask 120 positioned in the object plane 202 at greater angles than the used aperture. In other words, the light is diffracted at a greater angle than the maximum opening angle θmax that is defined by the NA stop 212. This is shown in FIG. 2 with reference to a light ray S6. This can occur at regularly imaged structures of the photomask 120 at higher orders of diffraction and also at assist structures such as what are known as SRAFs (sub-resolution assist features).

These are intended to redistribute light such that used structures are imaged without thinning at the ends or other errors. However, they themselves should be invisible in the image, that is to say in the field plane 208. For this reason, they are chosen to be so small that all orders of diffraction capable of being imaged are located outside the entrance pupil EP1 or outside the used aperture and are ideally blocked at the NA stop 212. In other words, light rays having a greater opening angle θ than the maximum opening angle θmax determined by the NA stop 212 are blocked at the NA stop 212.

In terms of construction, however, it is desirable to provide the beam path 218 with a housing 222 at least in the region of the photomask 120. The housing 222 serves for maintaining the vacuum and for keeping away contamination. However, grazing incidence reflections may take place at the housing 222. The reflection changes the beam angle for selected angle ranges such that the light after the reflection is located again back in the used aperture EP. However, the light now appears to come from a virtual object point OV outside the used field 210. The virtual object point OV is assigned a virtual entrance pupil EP2 defining an angle space W4.

In FIG. 2, the light ray S6 after the reflection at the housing 222 is given the reference sign S6'. An extension of the light ray S6' in the direction of the object plane 202 leads to the virtual object point OV. An extension of the light ray S6 beyond the housing 222 is given the reference sign S6". The NA stop 212 can now no longer intercept the false light in the form of the reflected light ray S6' because the opening angle θ after the reflection at the housing 222 appears to be "right". That means that the opening angle θ is smaller than the maximum opening angle θmax defined by the NA stop 212. As a result, it is not only light L1 from the object points O of the used field 210 that passes through the NA stop 212 but also light L2 from virtual object points OV outside the used field 210. The light L2 can also be referred to as superaperture light or false light.

The aim is now to prevent the false light L2 from reaching the field plane 208. The false light L2 contributes no useful imaging information and would only lead to a contrast-reducing background in the field plane 208. The false light L2 is therefore be filtered out upstream of the field plane 208. For this purpose, the object points O are imaged as field points F2 and the virtual object points OV are imaged as field points F3 in the intermediate image plane 206. The field point F3 is assigned an intermediate image pupil AP3, which defines an angle space W5.

A stop 300, such as a false-light stop or scattered-light stop, which filters the false light L2 out of the beam path 218, is now arranged in the intermediate image plane 206. In other words, the virtual object points OV are imaged as field points F3 on the stop 300. The false light L2 can thus no longer reach the field plane 208. The stop 300 includes an aperture 302 that is defined by a light-determining edge 304.

In DUV lithography apparatuses 100B, a gas flow through the system is frequently implemented. This can be realized for example by blowing in and venting nitrogen or air. The gas flow effects cooling of the optical elements, heated by the absorption of light, and the discharge of harmful substances that could otherwise accumulate in the system due to factory influences or outgassing. At EUV wavelengths, operation takes place in general under a vacuum, as was explained in the introductory part. However, a low gas pressure of approx. one pascal prevails here, too. Hydrogen can be used. The gas flow is provided to contribute to the photo-cleaning and occasionally realize a limited cooling effect.

The gas flow is implemented by few inlet positions and outlet openings, wherein the challenge in terms of design is to keep the number of such openings low. For this reason, u) the gas should flow through the optical system 200 in a defined manner, for example as freely as possible. At the same time, however, the optical system 200 has a multiplicity of stops 212, 300, as explained above, which can obstruct the gas flow.

The stops 212, 300 are typically designed in the form of thin metal sheets having an adapted geometry and aperture 214, 302. As a result, the stops 212, 300 are comparatively light-weight and stiff and do not introduce any undesired substances into the optical system 200. This setup furthermore permits cheap yet precise manufacturing. In this compact form, however, the stops 212, 300 block the desired gas flow through the optical system 200. This decreases either the desired cooling and cleaning effects of the gas flow or involves a greater system complexity owing to additional inlet and outlet openings. The aim is to unify these contradicting demands, that is, to be opaque and gas-permeable. The way in which a stop 212, 300 can fulfil these desired properties will be explained below with reference to the stop 300.

Figure 4:
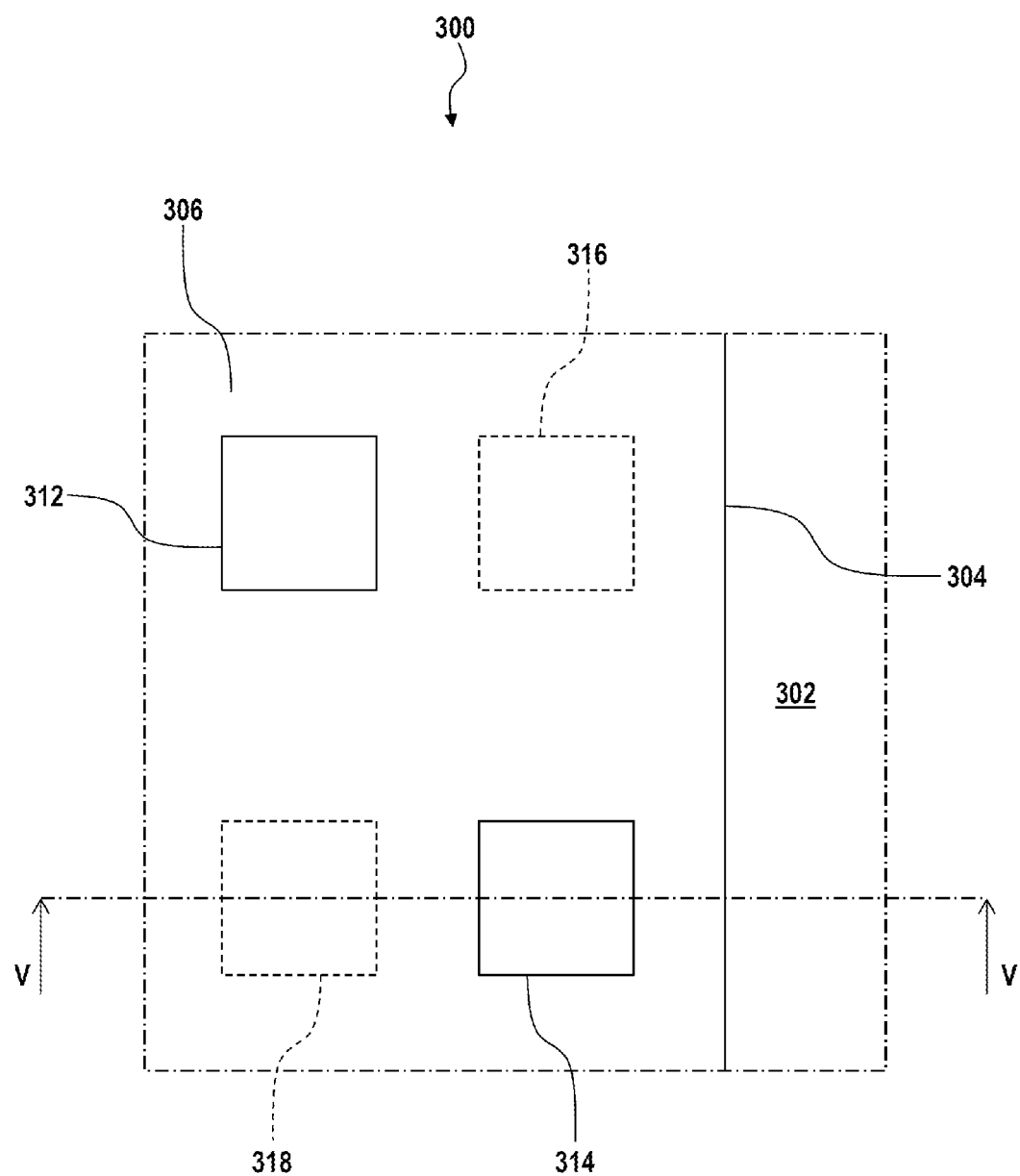
FIG. 4 shows a schematic view of an embodiment of a stop for the optical system according to FIG. 2.
Figure 5:
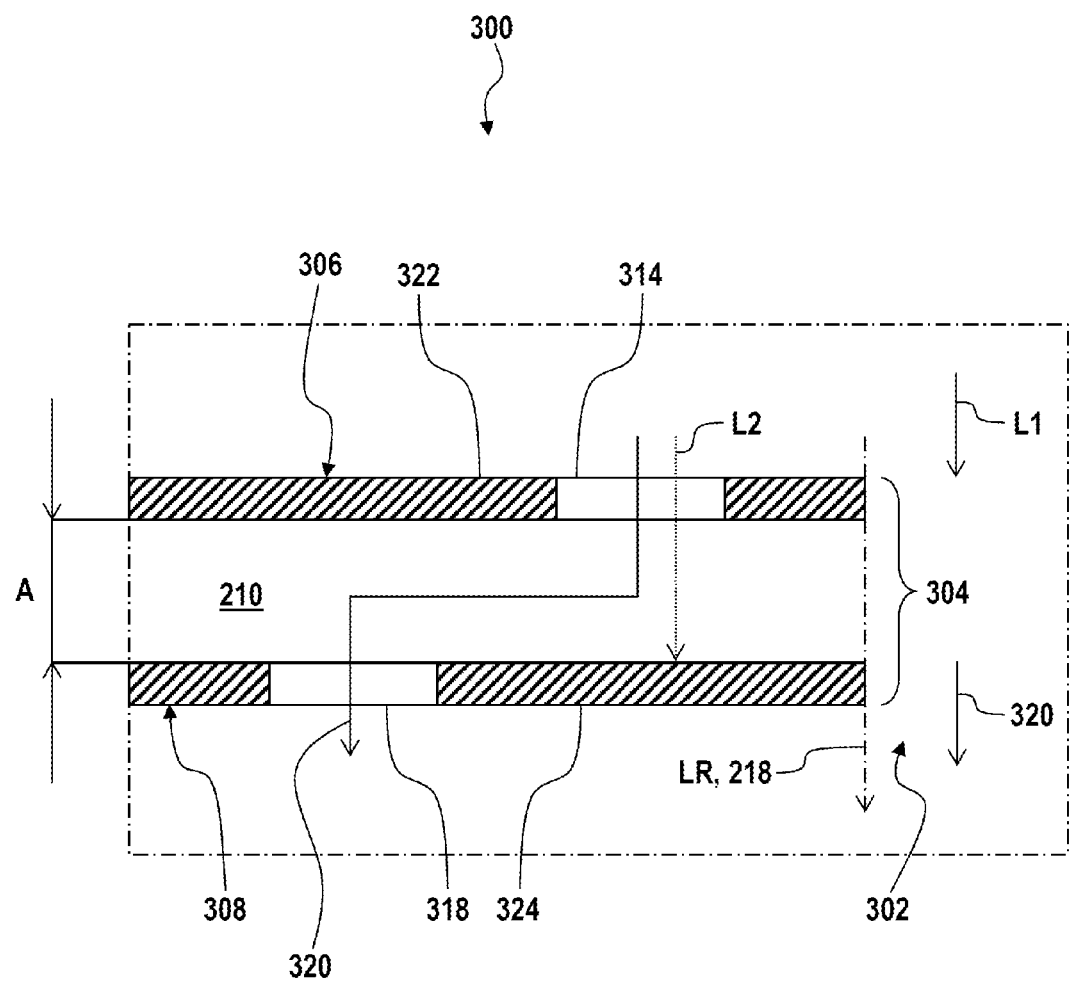
FIG. 5 shows a schematic sectional view of the stop in accordance with the sectional line V-V in FIG. 4.

FIG. 4 shows a schematically highly simplified detail of an embodiment of a stop 300 that is suitable for the intermediate image plane 206. FIG. 5 shows a schematic sectional view of the stop 300 in accordance with the sectional line V-V in FIG. 4. Reference is made below to FIGS. 4 and 5 simultaneously.

The stop 300 includes, as explained above, an aperture 302 having a light-determining edge 304 defining the aperture 302. The light-determining edge 304 can be curved or at least partially curved. The light-determining edge 304 can, however, also be straight or at least partially straight. The aperture 302 can thus have any desired geometry.

The stop 300 is assigned a first stop element 306 and a second stop element 308, which are arranged at a distance A from one another along the beam path 218, for example viewed in a light direction LR. The number of the stop elements 306, 308 is arbitrary in general. However, at least two stop elements 306, 308 are provided. The distance A can be a few fractions of millimetres to a few millimetres. An intermediate space 310 is provided between the stop elements 306, 308.

The stop elements 306, 308 each have a multiplicity of perforations or openings 312, 314, 316, 318, which are arranged with an offset with respect to one another such that a fluid flow 320 can flow through the openings 312, 314, 316, 318, but the false light L2 is blocked. The fluid flow 320 is for example a gas flow or can be called that. This fluid permeability with simultaneous opacity is achieved in that first openings 312, 314 provided in the first stop element 306 are obscured by the second stop element 308 that is arranged behind the first one, and second openings 316, 318 provided in the second stop element 308 are obscured by the first stop element 306 that is arranged before the second one. A fluid connection between a front side 322 and a rear side 324 of the stop 300, and vice versa, is thus realized with the aid of the openings 312, 314, 316, 318.

The false light L2 is blocked in its propagation, which is rectilinear aside from minimal diffraction, whereas gas molecules can move through the stop 300 by way of multiple changes of direction owing to the openings 312, 314, 316, 318. Depending on the geometric circumstances and the specific gas used and also on the gas pressure, the geometry, number, size and/or distribution of the openings 312, 314, 316, 318 can be adapted as desired.

The number and size of the openings 312, 314, 316, 318 is arbitrary. The openings 312, 314, 316, 318 can be arranged in the form of a grid or patterns and thus be regularly spaced apart from one another. Alternatively, the openings 312, 314, 316, 318 can also be arranged irregularly or with random distribution. The openings 312, 314, 316, 318 can have a rectangular, for example square, geometry. However, the openings 312, 314, 316, 318 can also have any other geometry. The openings 312, 314, 316, 318 can be introduced into the stop elements 306, 308 with the aid of a laser method, for example.

Figure 6:
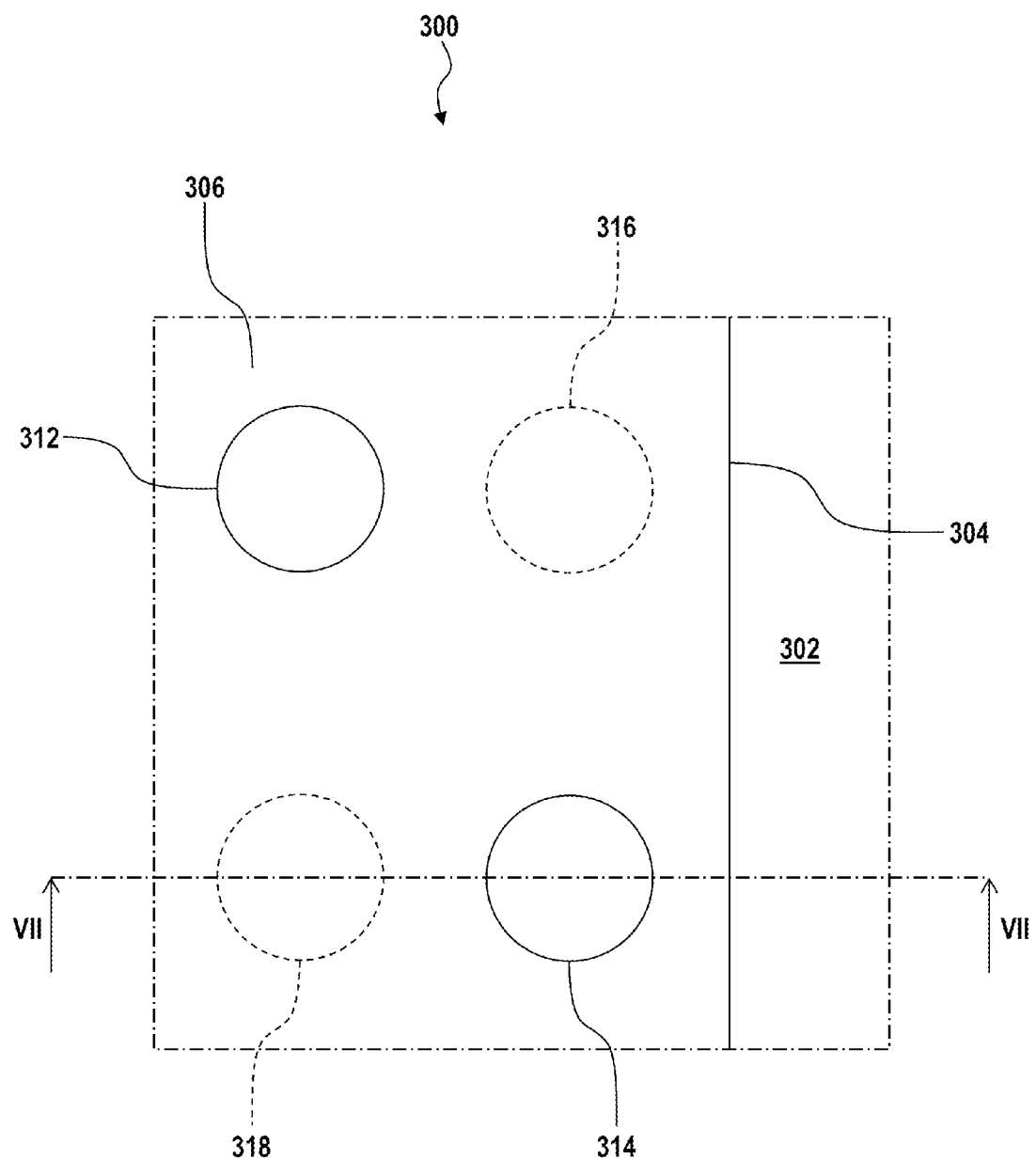
FIG. 6 shows a schematic view of an embodiment of a stop for the optical system according to FIG. 2.
Figure 7:
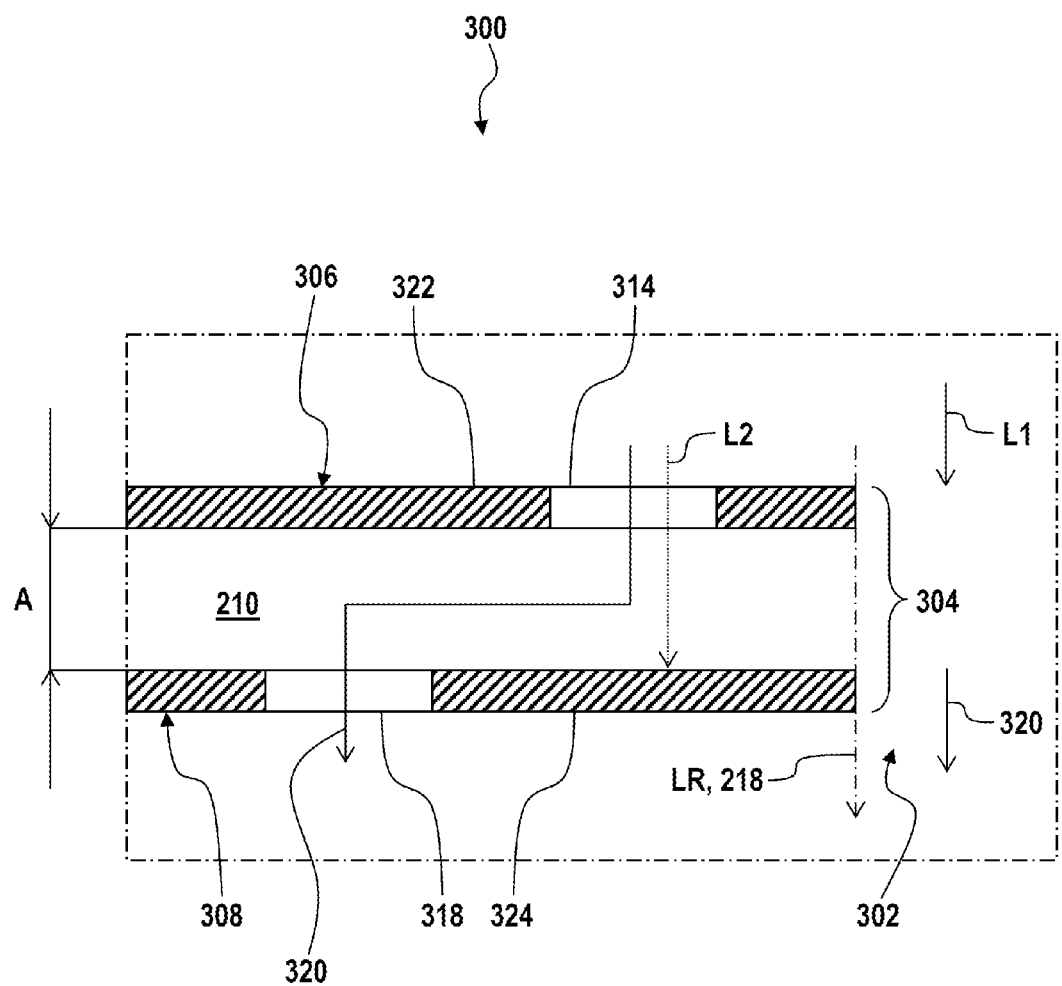
FIG. 7 shows a schematic sectional view of the stop in accordance with the sectional line VII-VII in FIG. 6.

FIG. 6 shows a schematically highly simplified detail of an embodiment of a stop 300. FIG. 7 shows a schematic sectional view of the stop 300 in accordance with the sectional line VII-VII in FIG. 6. Reference is made below to FIGS. 6 and 7 simultaneously.

The embodiment of the stop 300 according to FIGS. 6 and 7 differs from the embodiment of the stop 300 according to FIGS. 4 and 5 only in that the openings 312, 314, 316, 318 are not rectangular but round, for example circular. However, the openings 312, 314, 316, 318 can also be oval, for example.

Figure 8:
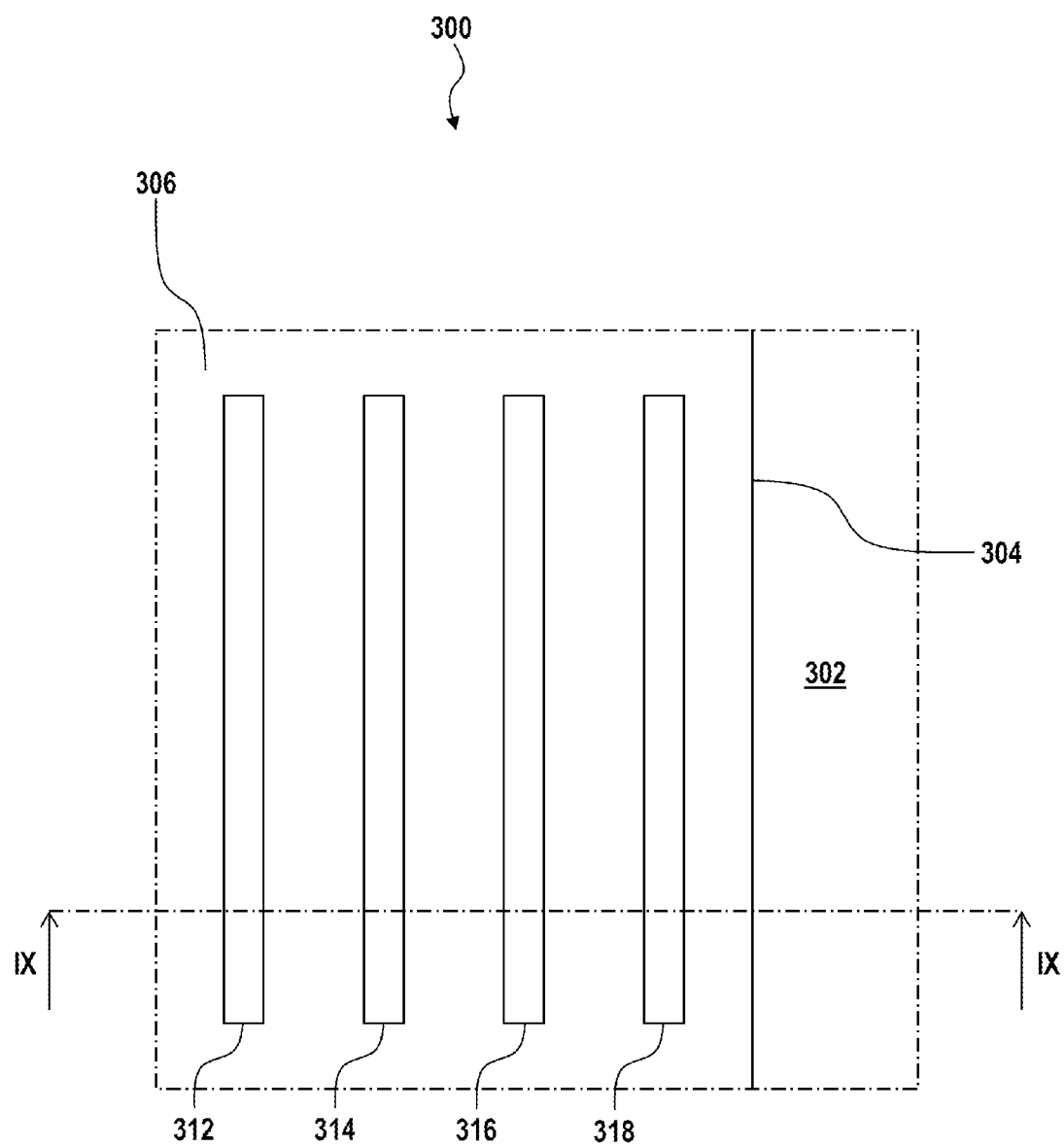
FIG. 8 shows a schematic view of an embodiment of a stop for the optical system according to FIG. 2.
Figure 9:
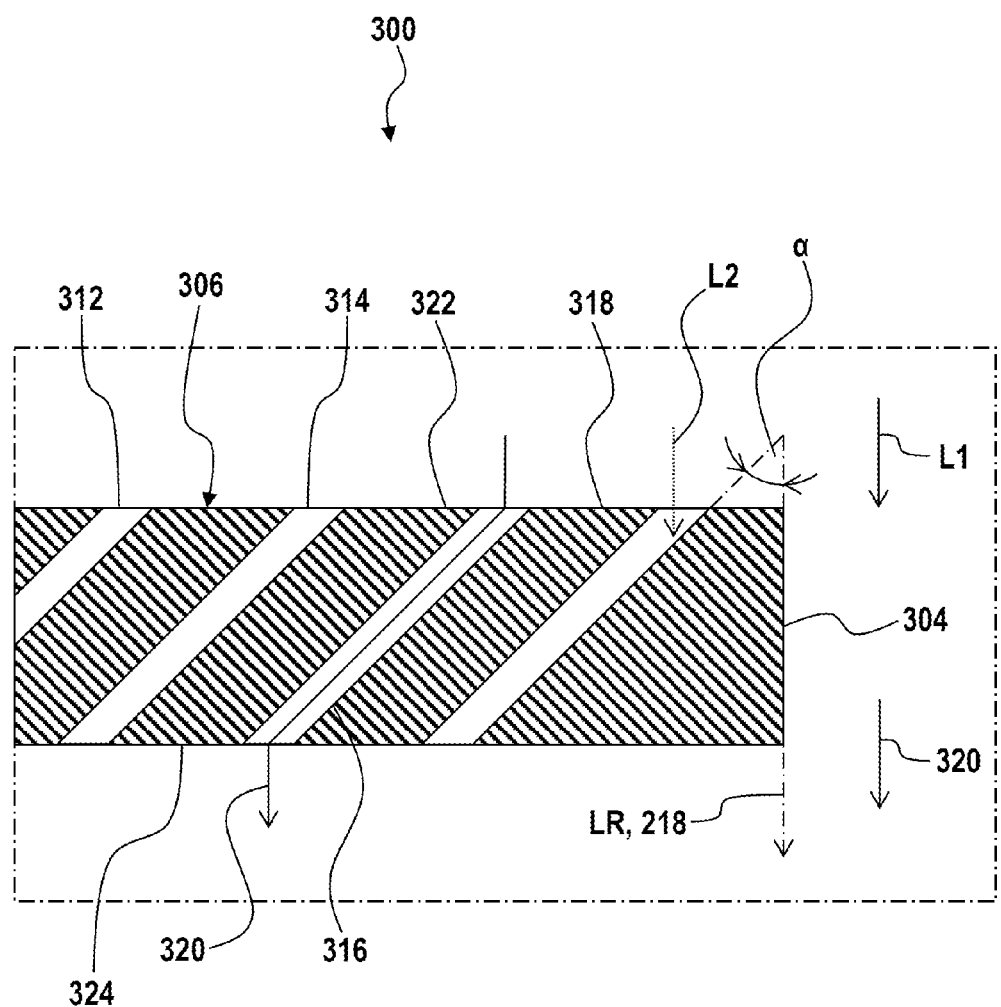
FIG. 9 shows a schematic sectional view of the stop in accordance with the sectional line IX-IX in FIG. 8.

FIG. 8 shows a schematically highly simplified detail of an embodiment of a stop 300. FIG. 9 shows a schematic sectional view of the stop 300 in accordance with the sectional line IX-IX in FIG. 8. Reference is made below to FIGS. 8 and 9 simultaneously.

The embodiment of the stop 300 according to FIGS. 8 and 9 differs from the embodiment of the stop 300 according to FIGS. 4 and 5 in that only one stop element 306 is provided, which includes slit-type openings 312, 314, 316, 318. The openings 312, 314, 316, 318 are inclined at an angle of inclination α relative to the light direction LR. This is understood to mean that the openings are guided at an angle through the stop 300 or at an angle through the stop element 306. The stop 300 or the stop element 306 is thus a monolithic component. For the purposes of mechanical stability, a solid enclosing frame is left around the openings 312, 314, 316, 318.

Figure 10:
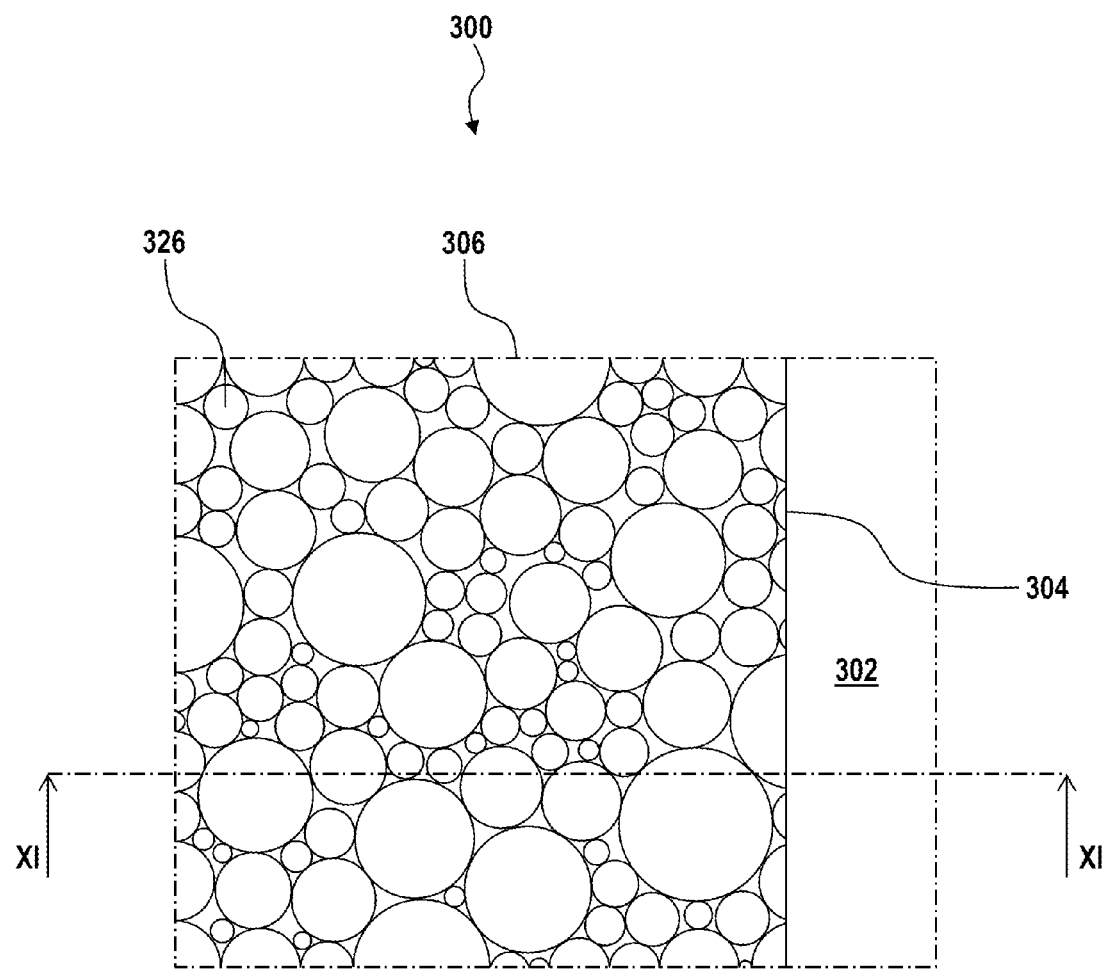
FIG. 10 shows a schematic view of an embodiment of a stop for the optical system according to FIG. 2.
Figure 11:
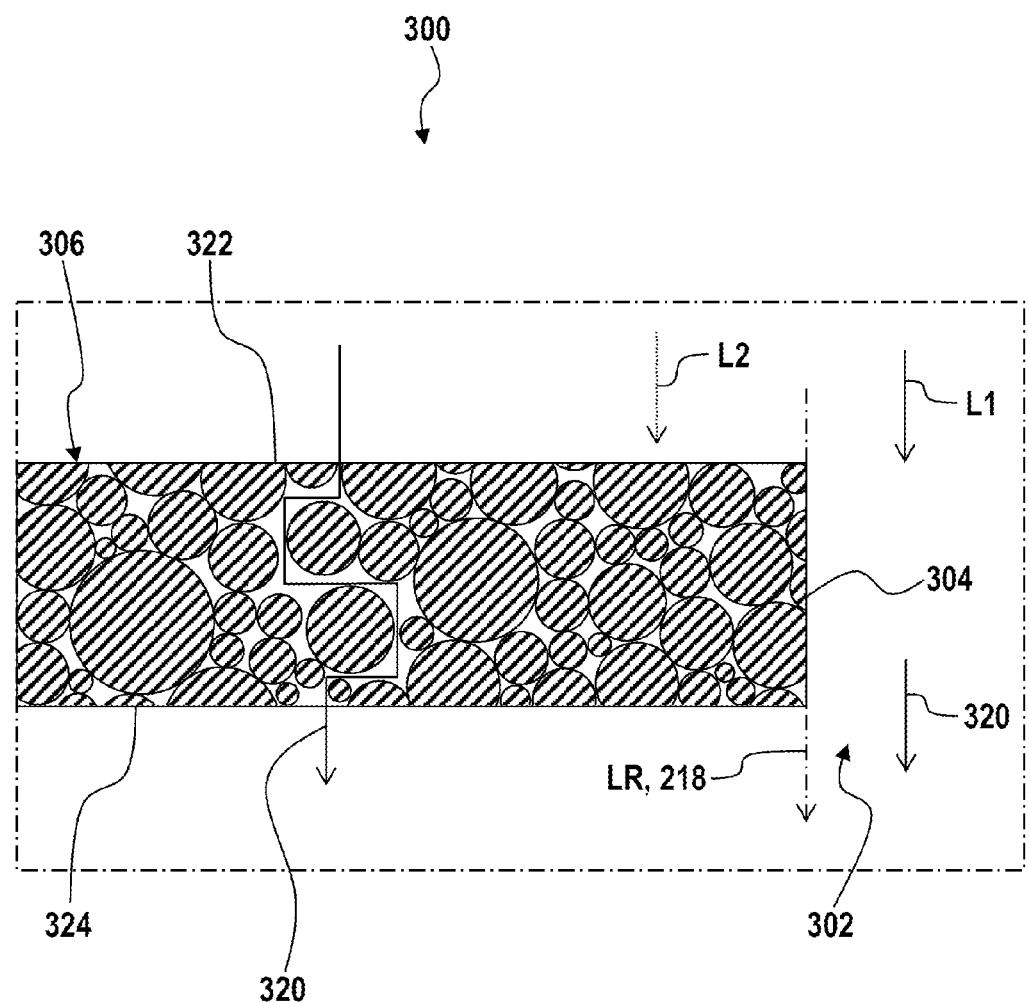
FIG. 11 shows a schematic sectional view of the stop in accordance with the sectional line XI-XI in FIG. 10.

FIG. 10 shows a schematically highly simplified detail of an embodiment of a stop 300. FIG. 11 shows a schematic sectional view of the stop 300 in accordance with the sectional line XI-XI in FIG. 10. Reference is made below to FIGS. 10 and 11 simultaneously.

In this embodiment of the stop 300, likewise only one stop element 306 is provided, which is made from a porous material. The fluid flow 320 can pass through the porous material, while the false light L2 is blocked. The porous material can be a sintered metal powder or ceramic powder, for example. For example, the stop element 306 or the stop 300 can be composed of fixedly connected, for example sintered, granulate grains 326, between which the fluid flow 320 can flow almost freely.

Although the present disclosure has been described on the basis of exemplary embodiments, it is modifiable in diverse ways.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Optical system
202 Object plane
204 Pupil plane
206 Intermediate image plane
208 Field plane
210 Used field
212 NA stop
214 Aperture
216 Light-determining edge
218 Beam path
220 Working light
222 Housing
300 Stop
302 Aperture
304 Light-determining edge
306 Stop element
308 Stop element
310 Intermediate space
312 Opening
314 Opening
316 Opening
318 Opening
320 Fluid flow
322 Front side
324 Rear side
326 Granulate grain
A Distance
AP1 Exit pupil
AP2 Intermediate image pupil
AP3 Intermediate image pupil
EP1 Entrance pupil
EP2 Entrance pupil
F1 Field point
F2 Field point
F3 Field point
LR Light direction
L1 Light
L2 False light M Centre point
M1 Mirror
M2 Mirror
M3 Mirror
M4 Mirror
M5 Mirror
M6 Mirror
O Object point
OV Virtual object point
P Point
R Direction
S1 Light ray
S2 Light ray
S3 Light ray
S4 Light ray
S5 Light ray
S6 Light ray
S6' Light ray
S6" Light ray
V Direction vector
W1 Angle space
W2 Angle space
W3 Angle space
W4 Angle space
W5 Angle space
α Angle of inclination
θ Opening angle
θmax Opening angle
φ Circumferential angle

What is claimed is:

1. A stop, comprising:
a light-transmissive aperture;
a first stop element; and
a second stop element,
wherein:
the aperture is provided in the first and second stop elements or at the first and second stop elements;
outside the aperture, each of the first and second stop elements comprises an opaque region and a fluid-permeable region;
the fluid-permeable region of the first stop element is offset from the fluid-permeable region of the second stop element so that:
i) a fluid passing through the fluid-permeable region of the first stop element is deflected by the opaque region of the second stop element before passing through the fluid-permeable region of the second stop element; and
ii) light passing through the fluid permeable region of the first stop element is unable to pass through the fluid permeable region of the second stop element.

2. The stop of claim 1, wherein the stop is selected from the group consisting of a numerical aperture stop, an obscuration stop, and a false-light stop.

3. The stop of claim 1, wherein the first and second stop elements are configured to repeatedly deflect a fluid flow flowing through the stop.

4. The stop of claim 1, wherein each of the first and second stop elements comprises a multiplicity of opaque regions and a multiplicity of fluid-permeable regions.

5. The stop of claim 4, wherein t the multiplicity of fluid-permeable regions of the first and second stop elements fluidically connect a front side of the stop with a rear side of the stop.

6. The stop of claim 4, wherein the fluid permeable regions of the first and second stop elements have a circular cross section or a rectangular cross section.

7. The stop of claim 1, wherein along a direction:
an entirety of the opaque region of the first stop element is above an entirety of the fluid-permeable region of the second stop element; and
an entirety of the opaque region of the second stop element is below an entirety of the fluid-permeable region of the first stop element.

8. The stop of claim 1, wherein:
the aperture is configured to allow light to pass therethrough along a direction; and
along the direction, the first stop element is a distance from the second stop element.

9. The stop of claim 1, wherein, for each of the first and second stop elements, the fluid-permeable region is a slit that passes through the stop element at an angle of inclination.

10. The stop of claim 1, wherein the second stop element is a last stop element of the stop, and the second stop element comprises a multiplicity of fluid-permeable regions.

11. The stop of claim 1, wherein the fluid-permeable region of the first stop element comprises a porous material that is fluid-permeable due to its pores.

12. The stop of claim 1, wherein the aperture is fluid-permeable.

13. The stop of claim 1, wherein the aperture is delimited via a light-determining edge, and the light-determining edge is closed in terms of its perimeter or is open in terms of its perimeter.

14. An optical system, comprising:
a stop according to claim 1,
wherein:
the optical system has an object plane, a field plane and an intermediate image plane between the object and field planes;
the stop is in the intermediate image plane; and
the optical system is a lithography optical system.

15. The optical system of claim 14, wherein the stop is configured to filter out false light from a beam path of the optical system upstream of the field plane.

16. The optical system of claim 15, wherein the optical system comprises a plurality of stops disposed successively in the beam path.

17. An apparatus, comprising:
a stop according to claim 1,
wherein the apparatus is a lithography apparatus.

18. The apparatus of claim 17, wherein the apparatus comprises a projection system, and the projection system comprises the field facet system.

19. The apparatus of claim 18, wherein:
the projection system has an object plane, a field plane and an intermediate image plane between the object and field planes; and
the stop is in the intermediate image plane.

20. A stop, comprising:
a light-transmissive aperture;
a first stop element; and
a second stop element,
wherein:
the aperture is provided in the first and second stop elements or at the first and second stop elements;
outside the aperture, each of the first and second stop elements comprises an opaque region and a fluid-permeable region; and
along a direction:

i) an entirety of the opaque region of the first stop element is above an entirety of the fluid-permeable region of the second stop element; and ii) an entirety of the opaque region of the second stop element is below an entirety of the fluid-permeable region of the first stop element.

\* \* \* \* \*

UNITED STATES PATENT AND TRADEMARK OFFICE
CERTIFICATE OF CORRECTION

| | | |
|---|---|---|
| PATENT NO. | : 12,222,655 B2 | Page 1 of 1 |
| APPLICATION NO. | : 17/554029 | |
| DATED | : February 11, 2025 | |
| INVENTOR(S) | : Benjahman Julius Modeste et al. | |

It is certified that error appears in the above-identified patent and that said Letters Patent is hereby corrected as shown below:

In the Specification

Column 1, Line 9, delete "PCT/EP2020/068329," and insert -- PCT/EP2020/068239, --.

Column 1, Lines 54-55, delete "faces tory" and insert -- factory --.

Column 7, Line 28, delete "s FIG." and insert -- FIG. --.

Column 8, Lines 61-67, delete "In other words, each field point F1 of the field plane 208 thus sees all the light points in the pupil plane 204. This is also true in the reverse: The light in an angle space over the pupil plane 204 is assigned a location in the field plane 208. The exit pupil AP1 is thus field constant. The light that is incident on the field plane 208 is constant for every field point F1." and insert the same on Column 8, Line 60, as a continuation of the same paragraph.

Column 10, Line 18, delete "reason, u)" and insert -- reason, --.

In the Claims

Column 13, Line 64, in Claim 5, after "wherein" delete "t".

Signed and Sealed this
Thirteenth Day of May, 2025

Coke Morgan Stewart
*Acting Director of the United States Patent and Trademark Office*